United States Patent
Nakagawa et al.

(10) Patent No.: US 10,060,803 B2
(45) Date of Patent: Aug. 28, 2018

(54) MEMS INTERNAL TEMPERATURE SENSOR HAVING THIN FILM THERMOPILE

(71) Applicant: OMRON Corporation, Kyoto-shi, Kyoto (JP)

(72) Inventors: Shinya Nakagawa, Kyoto (JP); Masao Shimizu, Kyoto (JP); Tsuyoshi Hamaguchi, Kyoto (JP)

(73) Assignee: OMRON Corporation, Kyoto-shi (JP)

( * ) Notice: Subject to any disclaimer, the term of this patent is extended or adjusted under 35 U.S.C. 154(b) by 180 days.

(21) Appl. No.: 15/103,366

(22) PCT Filed: Dec. 12, 2014

(86) PCT No.: PCT/JP2014/083042
§ 371 (c)(1),
(2) Date: Jun. 10, 2016

(87) PCT Pub. No.: WO2015/088024
PCT Pub. Date: Jun. 18, 2015

(65) Prior Publication Data
US 2016/0313193 A1    Oct. 27, 2016

(30) Foreign Application Priority Data

Dec. 13, 2013   (JP) ................. 2013-258686

(51) Int. Cl.
*G01K 17/00*   (2006.01)
*G01K 13/00*   (2006.01)
(Continued)

(52) U.S. Cl.
CPC .............. *G01K 13/002* (2013.01); *B81B 1/00* (2013.01); *G01K 1/08* (2013.01); *G01K 7/00* (2013.01); *G01K 17/00* (2013.01); *G01K 17/20* (2013.01)

(58) Field of Classification Search
None
See application file for complete search history.

(56) References Cited

U.S. PATENT DOCUMENTS

2015/0094914 A1* 4/2015 Abreu ................ B60H 1/00742
                                                              701/41
2015/0204733 A1* 7/2015 Newell .................... G01K 1/14
                                                              374/141
(Continued)

FOREIGN PATENT DOCUMENTS

CN         1595079 A      3/2005
CN       102217414 A     10/2011
(Continued)

OTHER PUBLICATIONS

Chinese Office action dated Jun. 5, 2017 in the counterpart Chinese patent application.
(Continued)

*Primary Examiner* — Andre Allen
(74) *Attorney, Agent, or Firm* — Metrolexis Law Group, PLLC (57) ABSTRACT

An internal temperature sensor includes substrates with one surface to be placed in contact with a measurement surface of an object to measure an internal temperature of the object, a heat flux sensor on another surface of the substrates, and a temperature sensor. The heat flux sensor is fabricated through a MEMS process and includes first and second temperature measurement parts, and a thin film including a thermopile to detect a temperature difference between the first and second temperature measurement parts. The thin film is supported by a thermally conductive member to form a space between the first temperature measurement part and the substrates and to extend parallel to the substrates. The thermally conductive member conducts heat traveling from the object through the substrates to the second temperature
(Continued)

measurement part. The temperature sensor measures the temperature of a part of the substrates that is in contact with the thermally conductive member.

11 Claims, 10 Drawing Sheets

(51) Int. Cl.
  *G01K 17/20*  (2006.01)
  *B81B 1/00*  (2006.01)
  *G01K 7/00*  (2006.01)
  *G01K 1/08*  (2006.01)

(56) References Cited

U.S. PATENT DOCUMENTS

| | | | |
|---|---|---|---|
| 2017/0016778 A1* | 1/2017 | Nakagawa | G01K 7/427 |
| 2017/0276553 A1* | 9/2017 | Nakagawa | G01K 13/002 |
| 2017/0343421 A1* | 11/2017 | Nakagawa | G01K 3/14 |
| 2017/0343422 A1* | 11/2017 | Nakagawa | G01K 7/028 |
| 2018/0024010 A1* | 1/2018 | Nakagawa | G01K 1/18 |

FOREIGN PATENT DOCUMENTS

| | | |
|---|---|---|
| CN | 102401699 A | 4/2012 |
| DE | 19800753 A1 | 7/1999 |
| DE | 102006012338 B3 | 7/2007 |
| EP | 2942003 A2 | 11/2015 |
| JP | S60-10138 A | 1/1985 |
| JP | S61-40634 U | 3/1986 |
| JP | S61-239127 A | 10/1986 |
| JP | 2002-372464 A | 12/2002 |
| JP | 2007-212407 A | 8/2007 |
| JP | 2012-154859 A | 8/2012 |
| JP | 2013-210327 A | 10/2013 |

OTHER PUBLICATIONS

Japanese Office Action (JPOA) dated Oct. 31, 2017 in a counterpart Japanese patent application.
German Office Action (DEOA) dated Jan. 25, 2018 in a counterpart German patent application.

\* cited by examiner

MEMS INTERNAL TEMPERATURE SENSOR HAVING THIN FILM THERMOPILE

FIELD

The present invention relates to an internal temperature sensor for measuring the internal temperature of an object.

BACKGROUND

Simple core body thermometers without heating (hereafter referred to as non-heating core body thermometers, refer to Patent Literatures 1 to 3) are used to measure the temperature of a core part of a body.

The basic principle for measuring (calculating) the core body temperature with a non-heating core body thermometer will now be described with reference to FIGS. 16A to 16C.

Figures 16A, 16B:
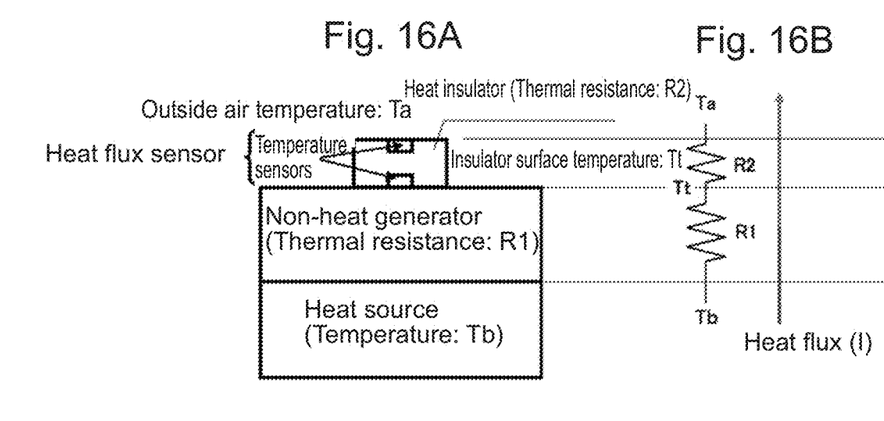
FIGS. 16A to 16C are diagrams describing the principle for measuring the core body temperature with an existing non-heating core body thermometer.
Figure 16C:
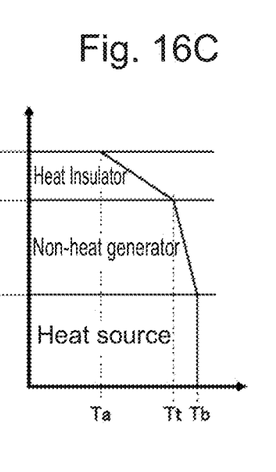

To measure the core body temperature with a non-heating core body thermometer, as shown in FIG. 16A, a heat flux sensor, which includes temperature sensors arranged separately on the upper and lower surfaces of a heat insulator having a relatively large area, is placed in tight contact with a body surface.

The thermal circuit shown in FIG. 16A can be expressed as an electric circuit in FIG. 16B, where Tb is the core body temperature, Ta is the temperature of the surface of the heat insulator exposed to the outside air, Tt is the temperature of the surface of the heat insulator in contact with the body surface, R1 is the thermal resistance of subcutaneous tissue as a non-heat generator, and R2 is the thermal resistance of the heat insulator.

When the temperature of each part of the heat flux sensor placed in tight contact with the body surface is stabilized, the quantity of heat passing through the non-heat generator per unit time is equal to the quantity of heat passing through the heat insulator per unit time. As a result, Formula 1 is derived.

$$(Tb-Tt)/R1=(Tt-Ta)/R2 \quad (1)$$

Thus, the core body temperature Tb can be calculated using Formula 2 below.

$$Tb=Tt+(Tt-Ta)\cdot R1/R2 \quad (2)$$

The non-heating core body thermometer calculates the core body temperature Tb based on the above principle.

CITATION LIST

Patent Literature

Patent Literature 1: Japanese Unexamined Patent Application Publication No. 2002-372464
Patent Literature 2: Japanese Unexamined Patent Application Publication No. 2012-154859
Patent Literature 3: Japanese Unexamined Patent Application Publication No. 2007-212407

SUMMARY

Technical Problem

The non-heating core body thermometer is smaller and less expensive and consumes less current than a core body temperature measuring device using a zero-heat-flow method. However, an existing non-heating core body thermometer measures a temperature difference using two temperature sensors separated from each other by a heat insulator between them. Due to the accuracy of these temperature sensors, the heat insulator needs to have high insulation to produce a temperature difference detectable by the two temperature sensors with intended accuracy. The non-heating core body thermometer thus includes a heat insulator with a large heat capacity, and can thus take at least about five minutes to obtain a stable measurement result of the core body temperature. Also, the heat insulator with high insulation can disturb the heat flow. The measurement accuracy of this non-heating core body thermometer is thus not very high.

In response to the above issue, one or more aspects of the present invention are directed to an internal temperature sensor that measures the internal temperature of an object with higher accuracy and higher responsiveness.

Solution to Problem

One aspect of the present invention provides an internal temperature sensor including a substrate, a heat flux sensor, and a temperature sensor. The substrate has one surface to be placed in contact with a surface of an object to measure an internal temperature of the object. The heat flux sensor is arranged on another surface of the substrate. The heat flux sensor is fabricated through a MEMS process. The heat flux sensor includes a first temperature measurement part, a second temperature measurement part, and a thin film including a thermopile that detects a temperature difference between the first temperature measurement part and the second temperature measurement part. The thin film is supported by a thermally conductive member to form a space between the first temperature measurement part and the substrate and to extend parallel to the substrate. The space has lower thermal conductivity than the thermally conductive member. The thermally conductive member conducts heat traveling from the object through the substrate to the second temperature measurement part. The temperature sensor measures a temperature of a part of the substrate that is placed in contact with the thermally conductive member or a temperature of the second temperature measurement part of the thin film.

More specifically, the internal temperature sensor of the above aspect of the present invention includes the heat flux sensor fabricated through a MEMS process (in other words, the heat flux sensor that is compact and thus has a small heat capacity). The heat flux sensor in the internal temperature sensor of the above aspect of the present invention uses the thermopile to measure a temperature difference, and thus has high measurement accuracy of the temperature difference. The internal temperature sensor of the above aspect of the present invention measures the core body temperature of an object with higher accuracy and higher responsiveness than sensors known in the art.

In the sensor according to the above aspect of the present invention, the space having lower thermal conductivity than the thermally conductive member, which is formed between the first temperature measurement part and the substrate of the heat flux sensor, may be a space containing gas such as air, a vacuum space, or a space filled with a nongaseous substance with low thermal conductivity, such as resin.

In the internal temperature sensor according to the above aspect of the present invention, the thin film in the heat flux sensor may include a heat radiation accelerating structure for accelerating heat radiation from the first temperature measurement part. The thin film including the heat radiation accelerating structure allows higher-accuracy measurement of the core body temperature of an object. For example, the thin film including the heat radiation accelerating structure for accelerating heat radiation from the first temperature measurement part may include an infrared absorbing and radiating layer arranged on the upper surface of the first temperature measurement part (surface not facing the substrate) to absorb infrared rays emitted from the substrate and to radiate the infrared light upward (in the direction opposite to the substrate). When the upper surface of the first temperature measurement part is a flat surface (mirror surface), the flat upper surface reflects infrared rays traveling from below. In this case, the thin film having irregularities on the upper surface of the first temperature measurement part would also function as the thin film including the heat radiation accelerating structure for accelerating heat radiation from the first temperature measurement part.

Further, the heat flux sensor and the temperature sensor may be placed in the stationary surrounding air to stabilize the measurement result of the core body temperature. The internal temperature sensor of the above aspect of the present invention may further include a housing covering the heat flux sensor and the temperature sensor.

Also, the thin film in the heat flux sensor may include an infrared reflective structure that reflects infrared rays traveling toward a surface of the thin film not facing the substrate to prevent the thin film from being heated by the infrared rays. This stabilizes the measurement result of the core body temperature without using the housing.

Further, the housing may have an infrared absorber arranged on its inner surface. This further stabilizes the temperature inside the housing. Further, the housing may have an outer surface that reflects infrared rays and electromagnetic waves. This further stabilizes the temperature inside the housing, and prevents electromagnetic waves from adversely affecting the measurement result of the internal temperature.

The housing included in the internal temperature sensor may include a side wall surrounding the heat flux sensor and the temperature sensor, a heat insulator arranged at an end face of the side wall at an opening of the side wall, and a top plate attached to the side wall via the heat insulator to cover the opening of the side wall. Further, the top plate may be a heat sink or a radiator plate with a larger surface area to improve heat radiation. The internal temperature sensor may further include a member to transfer heat from the first temperature measurement part of the thin film to the top plate.

The internal temperature sensor of the above aspect of the present invention may be a sensor that directly outputs the outputs from the heat flux sensor and the temperature sensor. However, these sensors output low level signals. When the internal temperature sensor directly outputs such output signals, the internal temperature sensor may incorrectly calculate the internal temperature due to noise. The internal temperature sensor may further include an amplifier that amplifies an output from the heat flux sensor and an output from the temperature sensor. In addition to the amplifier, the internal temperature sensor may further include an arithmetic unit that calculates the internal temperature of the object based on the output from the heat flux sensor and the output from the temperature sensor amplified by the amplifier. This internal temperature sensor can calculate the internal temperature of an object without using an external device.

Advantageous Effects

The internal temperature sensor according to one or more embodiments of the present invention measures the internal temperature of an object with higher accuracy and higher responsiveness than sensors known in the art.

DETAILED DESCRIPTION

First Embodiment

Figure 1:
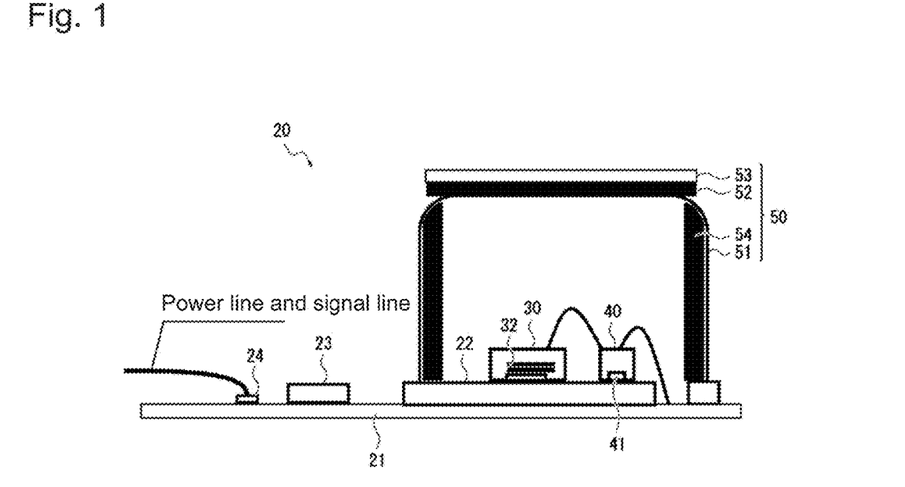
FIG. 1 is a schematic diagram of an internal temperature sensor according to a first embodiment of the present invention.

FIG. 1 is a schematic diagram showing the structure of an internal temperature sensor 20 according to a first embodiment of the present invention.

As shown in the figure, the internal temperature sensor 20 according to the present embodiment includes a main substrate 21, a sensor substrate 22 arranged on the main substrate 21, an arithmetic circuit 23, and a terminal 24. The internal temperature sensor 20 further includes a heat flux sensor 30 and an application specific integrated circuit (ASIC) 40, which are arranged on the sensor substrate 22, and a housing 50, which covers the heat flux sensor 30 and the ASIC 40.

The internal temperature sensor 20 measures the internal temperature of an object (human body or device) by placing the lower surface of the main substrate 21 in contact with the surface of the object. A lower surface and an upper surface of a member herein refer to a lower surface and an upper surface of the member shown in FIG. 1.

The main substrate 21 includes wiring between the ASIC 40, the arithmetic circuit 23, and the terminal 24. The main substrate 21 may have high thermal conductivity (low thermal resistance). If the main substrate 21 is thick, measuring the internal temperature of the main substrate 21 having high thermal conductivity can take time. Thus, the thickness of the main substrate 21 is to be minimized.

The terminal 24 on the main substrate 21 allows connection to a power line and a signal line extending from a measuring device for the internal temperature sensor 20. The measuring device for the internal temperature sensor 20 obtains a measurement result of the internal temperature from the internal temperature sensor 20 by communicating with the internal temperature sensor 20 via the signal line, and displays or records the obtained measurement result, or supplies power to the internal temperature sensor 20 via the power line.

Figure 2:
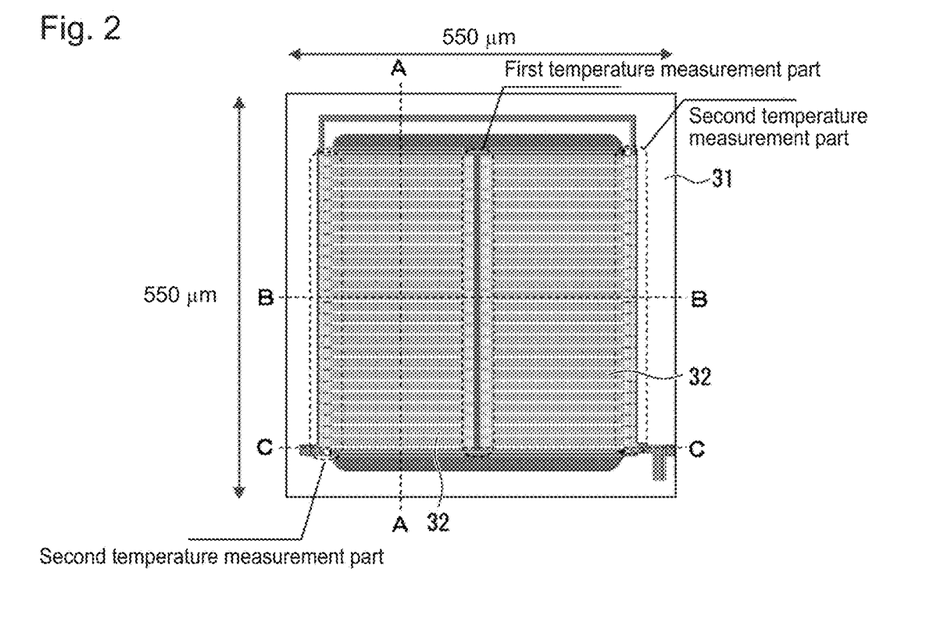
FIG. 2 is a top view of a heat flux sensor.
Figure 3:
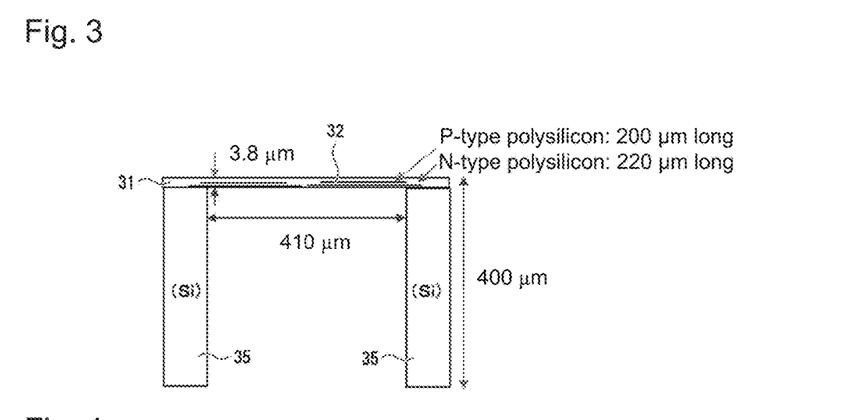
FIG. 3 is a cross-sectional view of the heat flux sensor taken along line B-B in FIG. 2.
Figure 4:
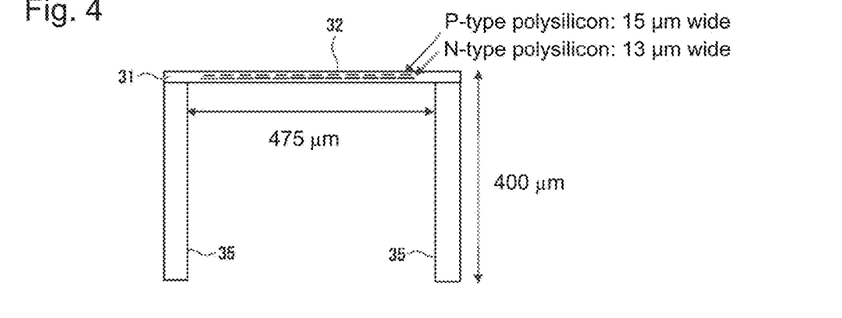
FIG. 4 is a cross-sectional view of the heat flux sensor taken along line A-A in FIG. 2.

The heat flux sensor 30 is a compact temperature difference sensor fabricated through micro electro mechanical systems (MEMS) processes (semiconductor processes including etching performed at a high aspect ratio). Although the heat flux sensor 30 is simplified in FIG. 1, the heat flux sensor 30 has the structure shown in FIGS. 2 to 4. FIG. 2 is a top view of the heat flux sensor 30 in one embodiment. FIG. 3 is a cross-sectional view of the heat flux sensor 30 taken along line B-B in FIG. 2. FIG. 4 is a cross-sectional view of the heat flux sensor 30 taken along line A-A in FIG. 2.

More specifically, the heat flux sensor 30 includes, for example, a square thin film 31 with a length of 550 μm on one side (refer to FIG. 2), and a support 35 with a length of about 400 μm (396.2 μm) (refer to FIGS. 3 and 4) extending downward from a peripheral part of a lower surface of the thin film 31. The support 35 is formed from silicon. The thin film 31 included in the heat flux sensor 30 contains a thermopile 32, which includes a plurality of thermocouples formed from p-type polysilicon and n-type polysilicon connected in series. As shown in FIGS. 2 and 3, the thermopile 32 contained in the thin film 31 can measure a temperature difference between a first temperature measurement part, which is a middle part of the thin film 31 in the horizontal direction in FIG. 2, and second temperature measurement parts, which are parts of the thin film 31 immediately above the support 35. The support 35, which is formed from silicon with high thermal conductivity, extends in a hollow square below the periphery of the thin film 31. The two second temperature measurement parts shown in FIG. 2 can be assumed to have the same temperature.

The thin film 31 in the heat flux sensor 30 excluding the thermopile 32 (p-type polysilicon, n-type polysilicon, and the wiring connecting parts) is formed from a material with relatively low thermal conductivity. More specifically, the thin film 31 is designed to have relatively low thermal conductivity as a whole.

Figure 5:
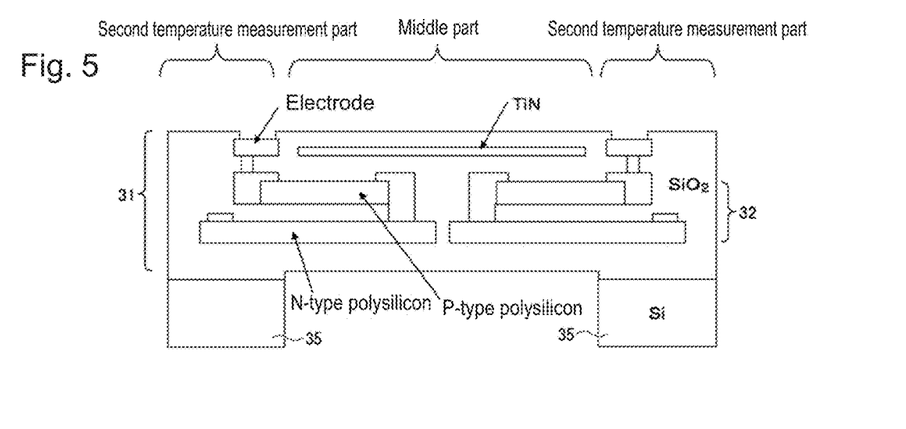
FIG. 5 is a schematic cross-sectional view of the main part of the heat flux sensor taken along line C-C in FIG. 2.
Figure 6:
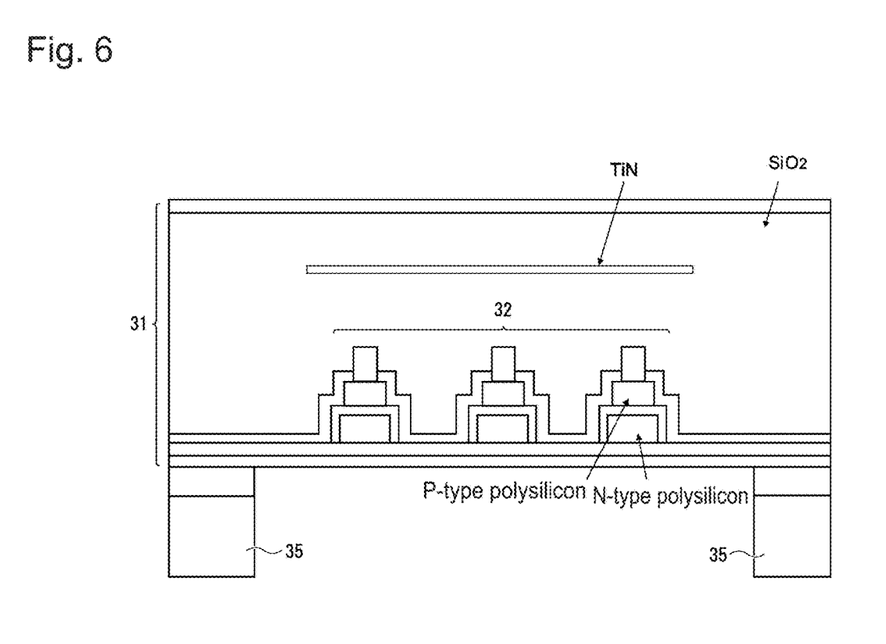
FIG. 6 is a schematic cross-sectional view of the heat flux sensor taken along line A-A in FIG. 2.

More specifically, the heat flux sensor 30 has, for example, the structure shown in FIGS. 5 and 6. FIG. 5 is a schematic cross-sectional view of the main part of the heat flux sensor 30 taken along line C-C in FIG. 2. FIG. 6 is a schematic cross-sectional view of the heat flux sensor 30 taken along line A-A in FIG. 2.

As shown in the figures, the thin film 31 in the heat flux sensor 30 excluding the thermopile 32 is formed from $SiO_2$, which has low thermal conductivity.

A TiN layer arranged above the thermopile 32 shown in FIGS. 5 and 6 is an infrared absorbing and radiating layer, which accelerates upward heat radiation from positions below a middle part of the thin film 31 (part excluding the second temperature measurement parts, or part having a space extending underneath). The heat flux sensor 30 may not have the infrared absorbing and radiating layer. However, the heat flux sensor 30 including no infrared absorbing and radiating layer typically can detect a small value as the temperature difference $\Delta T$. This slightly lowers the measurement accuracy of the internal temperature (described in detail later). The thin film 31 in the heat flux sensor 30 may thus have the infrared absorbing and radiating layer.

Referring back to FIG. 1, the heat flux sensor 30 will be described continuously.

The ASIC 40 is an integrated circuit with a built-in temperature sensor 41. The ASIC 40 amplifies an output of the heat flux sensor 30 and an output of the temperature sensor 41, and digitizes the amplified outputs. The ASIC 40 included in the heat flux sensor 30 according to the present embodiment includes a proportional to absolute temperature (PTAT) voltage generator, which outputs a voltage in proportion to an absolute temperature (more specifically, a voltage generator that functions as a thermometer). In other words, the ASIC 40 allows the components of the PTAT voltage generator to function as the temperature sensor 41. The ASIC 40 also amplifies an output from each sensor using a chopper amplifier.

The sensor substrate 22 on which the heat flux sensor 30 and the ASIC 40 are mounted has high thermal conductivity to allow the temperature sensor 41 to measure the temperature of the lower surface of the support 35 of the heat flux sensor 30. In other words, the sensor substrate 22 allows the temperature of a part fixed to the support 35 of the heat flux sensor 30 to be equal to the temperature of a part to be measured by the temperature sensor 41. When the main substrate 21 has sufficiently high thermal conductivity, the sensor substrate 22 can be eliminated. In this case, the heat flux sensor 30 and the ASIC 40 are directly mounted on the main substrate 21.

The arithmetic circuit 23 calculates the internal temperature of an object based on the output from the heat flux sensor and the output from the temperature sensor digitized by the ASIC 40, and outputs the calculated internal temperature. Although described in detail later, the arithmetic circuit 23 typically outputs (or transmits) the calculated internal temperature from the terminal 24, or outputs (or stores) the calculated internal temperature into its internal memory.

The housing 50 is a case that accommodates the heat flux sensor 30 and the temperature sensor 41 to provide the stationary surrounding air for the heat flux sensor 30 and the temperature sensor 41 (ASIC 40) and thus stabilize outputs from these sensors, and also to prevent infrared rays from entering the heat flux sensor 30 from above.

As shown in FIG. 1, the housing 50 in the present embodiment includes a tubular side wall 51, a top plate 53, and an infrared absorber 54. The side wall 51 surrounds the heat flux sensor 30 and the temperature sensor 41 (ASIC 40). The top plate 53 is attached on a heat insulator 52 at the opening of the side wall 51. The infrared absorber 54 covers the inner surface of the side wall 51. The side wall 51 typically has a diameter of about one centimeter or less.

Although the details (reasons or causes) are unknown, various experiments reveal that higher thermal conductivity between the side wall 51 and the sensor substrate 22 in the housing 50 improves the stability of the temperature inside the housing 50. The side wall 51 in the housing 50 may thus be fixed to the sensor substrate 22 with a thermally conductive adhesive (e.g., a silver paste).

The side wall 51 and the top plate 53 in the housing 50 may be formed from any material that prevents air from flowing into and out of the housing 50 and prevents infrared rays from entering the housing 50. Electromagnetic waves may also change outputs from the heat flux sensor 30 and the temperature sensor 41. The side wall 51 and the top plate 53 may thus be formed from a material that prevents entry of external electromagnetic waves, such as metal or an electrically conductive non-metallic material. The top plate 53 having an upper surface with a higher reflectance against infrared rays can stabilize the temperature inside the housing 50. The top plate 53 in the housing 50 may thus be formed from a material with a high infrared reflectance (e.g., aluminum), or may include a thin plate of a material with a high infrared reflectance attached on the upper surface of a member formed from a material with a relatively low infrared reflectance (e.g., stainless steel or SUS, or a non-metallic material). The lower surface of the top plate 53 exposed inside may be formed from an infrared absorber.

The heat insulator 52 in the housing 50 may be any member with heat insulation. The heat insulator 52 may be formed from a typical heat insulating material (e.g., urethane foam). The infrared absorber 54 in the housing 50 may be any member that easily absorbs infrared rays. For example, the infrared absorber 54 may be formed from black resin.

The principle for measuring the internal temperature with the internal temperature sensor 20 will now be described.

In the example described below, the substrates 21 and 22 have a thermal resistance that is assumed to be 0 (sufficiently smaller than the thermal resistance of a non-heat generating part of an object to be measured). As shown schematically in FIG. 7A, a thermal circuit is formed to transfer heat between different parts (indicated by arrows drawn using a solid line and broken lines) when the internal temperature of an object is measured using the internal temperature sensor 20. This thermal circuit can be expressed as an electric circuit shown in FIG. 7B. When R4>>R2 (when R4 is extremely greater than R2), the value of Ih' in the electric circuit is substantially equal to the value of Ih. The second temperature measurement parts in the thin film 31 in the heat flux sensor 30 are exposed to air. Thus, the inequality R4>>R2 holds for the internal temperature sensor 20 (heat flux sensor 30).

Figure 7A:
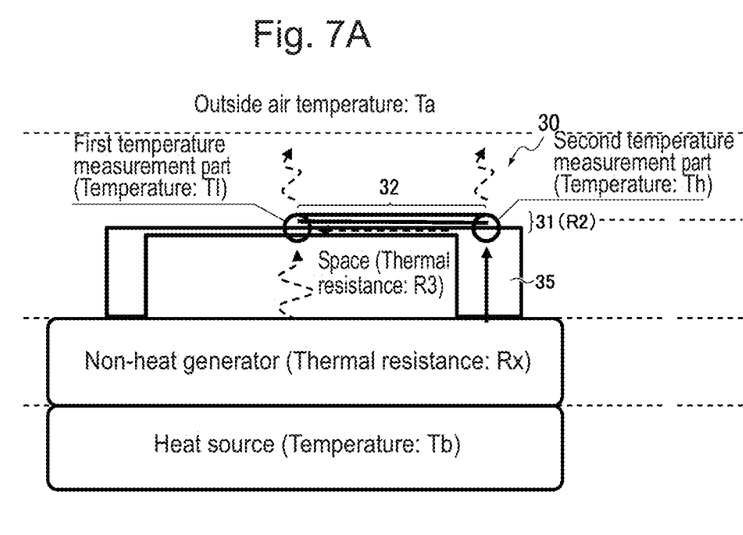
FIGS. 7A and 7B are diagrams describing the principle for measuring the internal temperature with the internal temperature sensor.
Figure 7B:
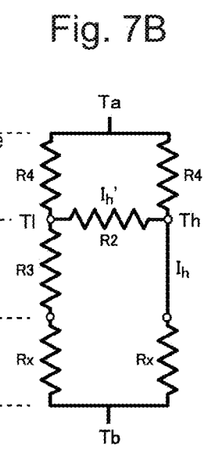

When the internal temperature sensor 20 placed in contact with the object reaches thermal equilibrium, a heat quantity Q1, which is the quantity of heat flowing from each second temperature measurement part toward the first temperature measurement part inside the thin film 31 in the heat flux sensor 30 per unit time, is substantially equal to a heat quantity Q2, which is the quantity of heat entering the support 35 of the heat flux sensor 30 from a non-heat generating part (object) per unit time.

When the internal temperature sensor 20 has reached thermal equilibrium, the heat quantity Q1 is calculated using Formula 3 below, and the heat quantity Q2 is calculated using Formula 4 below.

$$Q1=(Th-Tl)/R2 \quad (3)$$

$$Q2=(Tb-Tr)/Rx \quad (4)$$

In the formulas, Th is the temperature of the second temperature measurement parts, and Tl is the temperature of the first temperature measurement part, and Tr is the temperature of the lower end of the support 35 (the surface temperature of the non-heat generating part) measured by the temperature sensor 41.

Based on Q1≈Q2 and Th−Tl=ΔT, Formula 5 below substantially holds when the internal temperature sensor 20 has reached thermal equilibrium.

$$\Delta T/R2=(Tb-Tr)/Rx \quad (5)$$

Formula 5 is equivalent to Formula 6 below.

$$Tb=Tr+(Rx/R2)\Delta T \quad (6)$$

The appropriate value of Rx/R2 in Formula 6 is uniquely determined by the structure of the internal temperature sensor 20 (e.g., the size and the material of each part) and by an object to be measured. Thus, the internal temperature Tb can be calculated by Formula 6 above using the temperature difference ΔT measured by the heat flux sensor 30 and the temperature Tr measured by the temperature sensor 41.

When the substrates 21 and 22 have a thermal resistance that cannot be assumed to be 0, the internal temperature Tb can be calculated using Formula 7 below, which replaces Rx in Formula 6 with the value (hereafter Rx') obtained by adding the thermal resistance of the substrates 21 and 22 to Rx.

$$Tb=Tr+(Rx'/R2)\Delta T \quad (7)$$

The appropriate value of Rx'/R2 in Formula 7 is also uniquely determined by the structure of the internal temperature sensor 20 and by the object to be measured. Thus, the internal temperature Tb can be calculated using the temperature difference ΔT and the temperature Tr, although the thermal resistance of the substrates 21 and 22 cannot be assumed to be 0.

The value of Rx'/R2 or the value of Rx/R2 is the value k that minimizes an error in Formula 8 below.

$$Tb=Tr+k\Delta T \quad (8)$$

This value k can be calculated by the least-squares method using the values ΔT and Tr of the object to be measured (or another object resembling the object to be measured), which are measured by the internal temperature sensor 20 several times each with the internal temperature being varied. The internal temperature sensor 20 can thus determine the formula for calculating the internal temperature Tb (Formula 8) independently of whether the thermal resistance of the substrates 21 and 22 can be assumed to be 0.

The TiN layer (indicated by TiN in FIGS. 5 and 6) contained in the thin film 31 will now be described supplementarily.

From Formula 8 above, the internal temperature sensor 20 according to the present embodiment has higher sensitivity when the value ΔT measured by the heat flux sensor 30 is greater. As shown in FIGS. 7A and 7B, the value ΔT increases as the quantity of heat radiating upward from the first temperature measurement part increases. To further increase the quantity of upward heat radiation from the first temperature measurement part, the internal temperature sensor 20 may include an infrared absorbing and radiating layer for accelerating heat radiation. For this purpose, the TiN layer is arranged inside and adjacent to the first temperature measurement part of the thin film 31.

The quantity of upward heat radiation from the first temperature measurement part may be increased by forming fine irregularities on the upper surface of the first temperature measurement part. Such fine irregularities may be formed on the upper surface of the first temperature measurement part either in place of or in addition to the infrared absorbing and radiating layer in the first temperature measurement part.

The arithmetic circuit 23 (FIG. 1) will now be described.

The arithmetic circuit 23 included in (or mounted on) the internal temperature sensor 20 may be any circuit that can calculate the internal temperature Tb using the temperature difference ΔT and the temperature Tr.

The arithmetic circuit 23 can thus be a circuit that calculates the internal temperature Tb with Formula 8 using the predetermined value k based on the temperature difference ΔT and the temperature Tr. The arithmetic circuit 23 can be the above circuit that can additionally accept an instruction to change the value k (specifically a circuit that can change the value k in response to a command for changing the value k input through the terminal 24).

Figure 8:
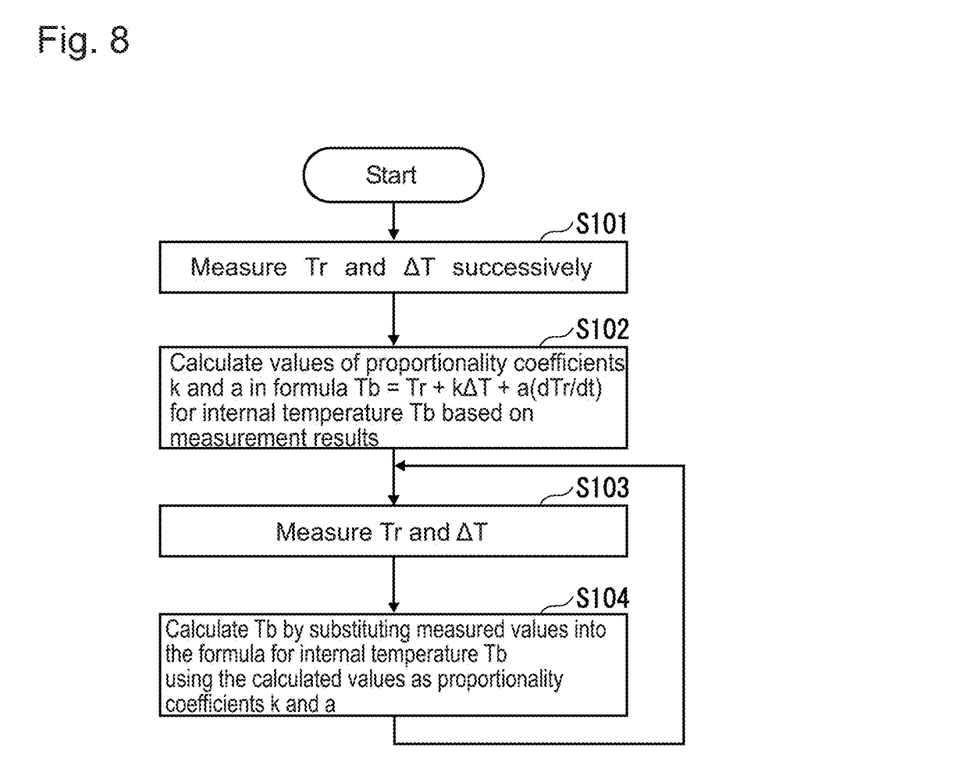
FIG. 8 is a flowchart showing an internal temperature calculation process.

The arithmetic circuit 23 may further be a circuit that starts the internal temperature measurement process with the procedure described in FIG. 8 when a predetermined condition is satisfied. The predetermined condition may be the condition under which a predetermined command is input at the terminal 24 or the condition under which the temperature Tr (temperature measured by the temperature sensor 41) starts increasing (in other words, the lower surface of the substrate 21 comes in contact with an object to be measured).

As shown in FIG. 8, the arithmetic circuit 23, which has started measuring the internal temperature, first measures the values of Tr and ΔT successively (cyclically) (step S101). This process typically ends before the internal temperature sensor 20 reaches thermal equilibrium (for example, the process ends when the rate of change in the value of ΔT reaches a predetermined value). As described above, the processing performed in step S101 is to collect data indicating the value Tr (the temperature measurement result obtained by the temperature sensor 41) and data indicating the value ΔT (the temperature measurement result obtained by the heat flux sensor 30) successively from the ASIC 40.

The arithmetic circuit 23, which has completed the processing in step S101, then calculates the values of coefficients k and a in the formula for calculating the internal temperature Tb that holds before thermal equilibrium is reached (described below) (step S102) based on the measurement results of the values Tr and ΔT (the data group collected from the ASIC 40).

$$Tb=Tr+k\Delta T+a(dTr/dt) \quad (9)$$

More specifically, the arithmetic circuit 23 performs the processing described below in step S102.

First, the arithmetic circuit 23 selects, from the measurement results collected in step S101, three measurement results (pairs of values Tr and ΔT) obtained at different times t1, t2, and t3 (t1<t2<t3). The values of Tr and ΔT measured at time tm (m=1 to 3) are referred to as $Tr_m$ and $\Delta T_m$.

The arithmetic circuit 23 calculates the value of dTr/dt at time t1 (hereafter, $dTr_1/dt$), the value of dTr/dt at time t2 (hereafter, $dTr_2/dt$), and the value of dTr/dt at time t3 (hereafter, $dTr_3/dt$).

Figure 9:
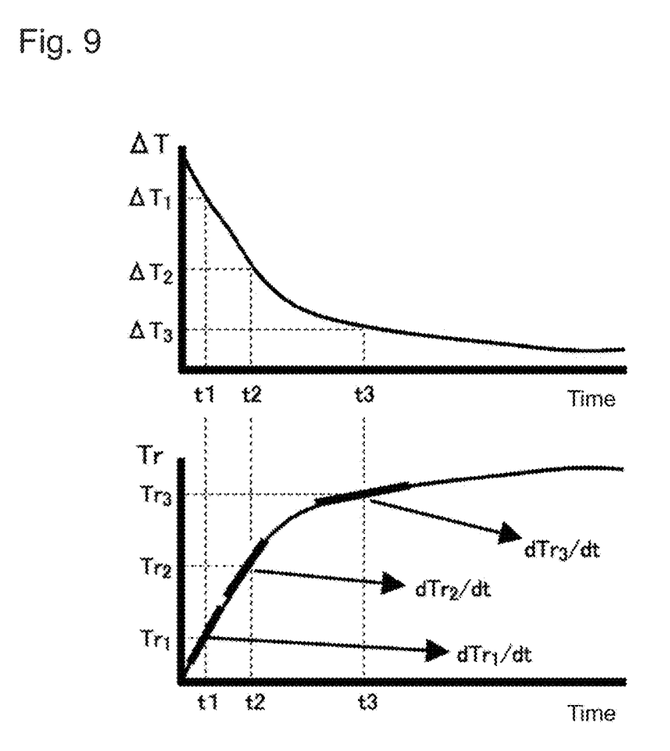
FIG. 9 is a graph showing values used to calculate coefficients k and a in the internal temperature calculation process.

The values $Tr_1$ to $Tr_3$ and the values $\Delta T_1$ to $\Delta T_3$ may be selected with any other method. However, the values $Tr_1$ to $Tr_3$ and the values $\Delta T_1$ to $\Delta T_3$ are to be selected in the manner shown in FIG. 9 to avoid close values 2Tr and 2ΔT. The values for the coefficients k and a can be calculated with high accuracy when the values $Tr_1$ to $Tr_3$ and the values $\Delta T_1$ to $\Delta T_3$ are selected in this manner.

The arithmetic circuit 23, which has selected the values $Tr_1$ to $Tr_3$ and $\Delta T_1$ to $\Delta T_3$ and calculated the values $dTr_1/dt$ to $dTr_3/dt$, solves the simultaneous equations below to calculate the values of k and a.

$$Tb=Tr_1+k\Delta T_1+a(dTr_1/dt)$$

$$Tb=Tr_2+k\Delta T_2+a(dTr_2/dt)$$

$$Tb=Tr_3+k\Delta T_3+a(dTr_3/dt)$$

More specifically, the arithmetic circuit 23 substitutes $Tr_1$ to $Tr_3$, $\Delta T_1$ to $\Delta T_3$, and $dTr_1/dt$ to $dTr_3/dt$ into the formulas for calculating the values of k and a derived from the above three equations.

The arithmetic circuit 23, which has calculated the values of k and a with the procedure described above, ends the processing in step S102. The arithmetic circuit 23 repeatedly performs the processing for measuring the values Tr and ΔT (step S103) and the processing for calculating and outputting the internal temperature Tb by substituting the measured values Tr and ΔT into the formula for calculating the internal temperature Tb (Formula 9) with the calculated values set as the values k and a (step S104).

The processing in step S104 may be the processing for outputting (transmitting) the calculated internal temperature Tb from the terminal 24, or the processing for outputting (storing) the calculated internal temperature Tb into a memory in the arithmetic circuit 23 that is accessible by a measuring device (device connected to the internal temperature sensor 20 via the terminal 24).

In the internal temperature calculation process shown in FIGS. 7A and 7B described above, the internal temperature Tb is calculated using the formula for calculating the internal temperature Tb (Formula 9) that holds before thermal equilibrium is reached, and further the values for the coefficients a and k used in the formula are calculated automatically. The arithmetic circuit 23, which performs this internal temperature calculation process, can be arranged in the internal temperature sensor 20 to accurately measure the internal temperature Tb of any object before thermal equilibrium is reached.

As described above, the heat flux sensor 30 included in the internal temperature sensor 20 according to the present embodiment is compact and thus has a small heat capacity (more specifically, the temperature in each part is stabilized in a short time). The heat flux sensor 30 uses the thermopile 32 to measure the temperature difference, and thus has high measurement accuracy of the temperature difference.

The thermopile 32, which is a horizontal thermopile, is easy to fabricate, whereas a vertical thermopile is difficult to fabricate. As described above, the temperature difference ΔT measured by the heat flux sensor 30 including the horizontal thermopile 32 can be used to measure (calculate) the internal temperature Tb of an object.

The internal temperature sensor 20 according to the present embodiment can thus accurately measure the internal temperature of an object with high responsiveness. Various experimental results reveal that the internal temperature sensor 20 including the heat flux sensor 30 with the size shown in FIGS. 2 to 4 can obtain stable measurement results after a wait time of three minutes at most.

Second Embodiment

Figure 10:
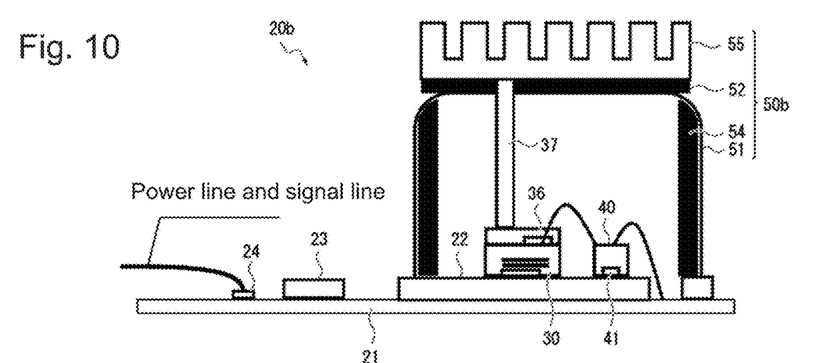
FIG. 10 is a schematic diagram showing the structure of an internal temperature sensor according to a second embodiment of the present invention.

FIG. 10 is a schematic diagram showing the structure of an internal temperature sensor 20b according to a second embodiment of the present invention.

The internal temperature sensor 20b includes many components common to the components of the internal temperature sensor 20 according to the first embodiment described above. The internal temperature sensor 20b will be described focusing on its components and functions different from those of the internal temperature sensor 20.

As shown in FIG. 10, the internal temperature sensor 20b includes a main substrate 21, a sensor substrate 22 arranged on the main substrate 21, an arithmetic circuit 23, a terminal 24, and a heat flux sensor 30 and an ASIC 40 arranged on the sensor substrate 22. These components and circuits are the same as the corresponding components of the internal temperature sensor 20 with the same names and reference numerals.

The internal temperature sensor 20b also includes a housing 50b for covering the heat flux sensor 30 and the ASIC 40. As shown in the figure, the housing 50b in the internal temperature sensor 20b includes a heat sink 55, which replaces the top plate 53 in the housing 50 (refer to FIG. 1).

A heat insulating structure 36 for second temperature measurement parts is further arranged on the heat flux sensor 30 in the internal temperature sensor 20b. Although simplified in FIG. 10, the heat insulating structure 36 has a recess at positions excluding its part facing the first temperature measurement part and its periphery part.

The heat insulating structure 36 and the heat sink 55 in the internal temperature sensor 20b are connected to each other by a high thermal conductivity member 37, which is formed from a material with high thermal conductivity (e.g., aluminum).

In other words, the internal temperature sensor 20b according to the second embodiment is a modification or an improvement of the internal temperature sensor 20 to have the temperature of the first temperature measurement part equal to the outside air temperature, and to retain heat in the second temperature measurement parts (to prevent an excessive increase in the quantity of heat radiation upward from the second temperature measurement parts).

The internal temperature sensor 20b can thus measure the internal temperature of an object more accurately than the internal temperature sensor 20.

Third Embodiment

The structure of an internal temperature sensor 20c according to a third embodiment of the present invention will now be described with reference to FIG. 11, focusing on its differences from the internal temperature sensors 20 and 20b described above.

Figure 11:
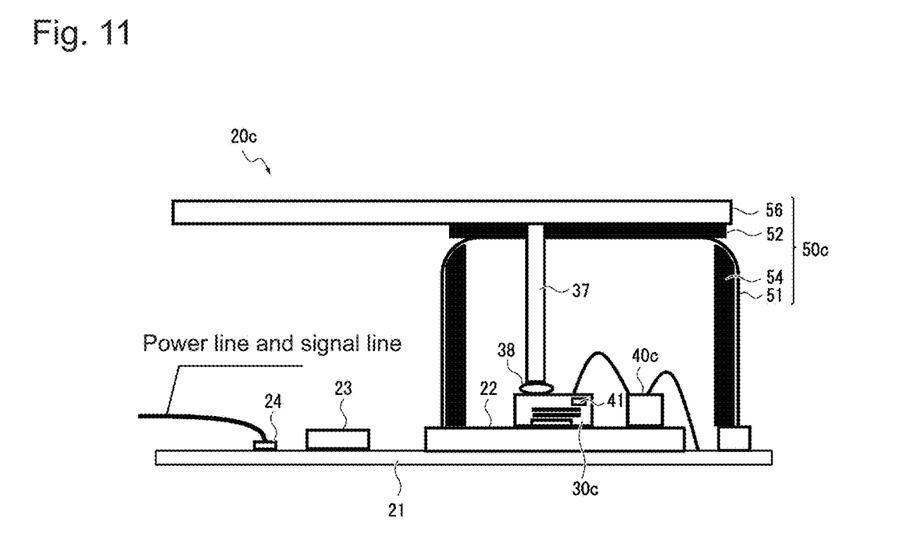
FIG. 11 is a schematic diagram showing the structure of an internal temperature sensor according to a third embodiment of the present invention.

As shown in FIG. 11, the internal temperature sensor 20c according to the present embodiment includes a sensor substrate 22, on which a heat flux sensor 30c and an ASIC 40c are arranged.

Figure 12:
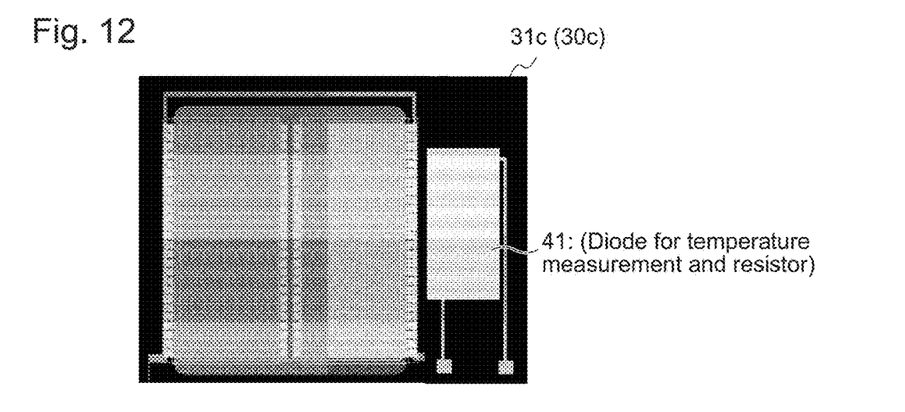
FIG. 12 is a top view of a heat flux sensor included in the internal temperature sensor according to the third embodiment.

The ASIC 40c is an integrated circuit corresponding to the ASIC 40 described above from which the temperature sensor 41 (a diode used as the temperature sensor 41 and a resistor) is eliminated. As schematically shown in FIG. 12, the heat flux sensor 30c includes a thin film 31c in which the temperature sensor 41 (the diode and other elements eliminated from the ASIC 40) is formed. In other words, the heat flux sensor 30c is an improvement of the heat flux sensor 30 to directly measure the temperature of the second temperature measurement parts. Although the details are not described, the internal temperature Tb can be calculated by using Formula 8 or Formula 9 described above, although the temperature measured by the temperature sensor 41 is the temperature of the second temperature measurement parts. As a result, the internal temperature sensor 20c can incorporate an arithmetic circuit 23 that can calculate the internal temperature Tb by using Formula 8 using the predetermined value k based on the temperature difference ΔT and the temperature Tr, or an arithmetic circuit 23 that can perform the internal temperature measurement process (FIG. 8), in the same manner as the internal temperature sensor 20.

In comparison between FIGS. 11 and 10, a housing 50c in the internal temperature sensor 20c includes a radiator plate 56 with a relatively large area, which replaces the heat sink 55 in the housing 50b. The internal temperature sensor 20c also includes the high thermal conductivity member 37 connected to the first temperature measurement part in the thin film 31 (refer to FIG. 2) in the heat flux sensor 30c using a soft material 58 with high thermal conductivity (e.g., thermally conductive silicone rubber or silicone grease).

As described above, the heat flux sensor 30c included in the internal temperature sensor 20c according to the present embodiment has a small heat capacity, and thus stabilizes the temperature in each part in a short time. The heat flux sensor 30c uses the thermopile 32 to measure the temperature difference, and thus has high measurement accuracy of the temperature difference.

The internal temperature sensor 20c according to the present embodiment can thus accurately measure the internal temperature of an object with high responsiveness.

Modifications

The internal temperature sensors (20, 20b, and 20c) according to the above embodiments may be modified variously. For example, the internal temperature sensor 20c (FIG. 11) may be modified to include the heat sink 55, which replaces the radiator plate 56. The internal temperature sensors 20 and 20b may be modified to include the heat flux sensor 30c and the ASIC 40c, which replace the heat flux sensor 30 and the ASIC 40.

Figure 13A:
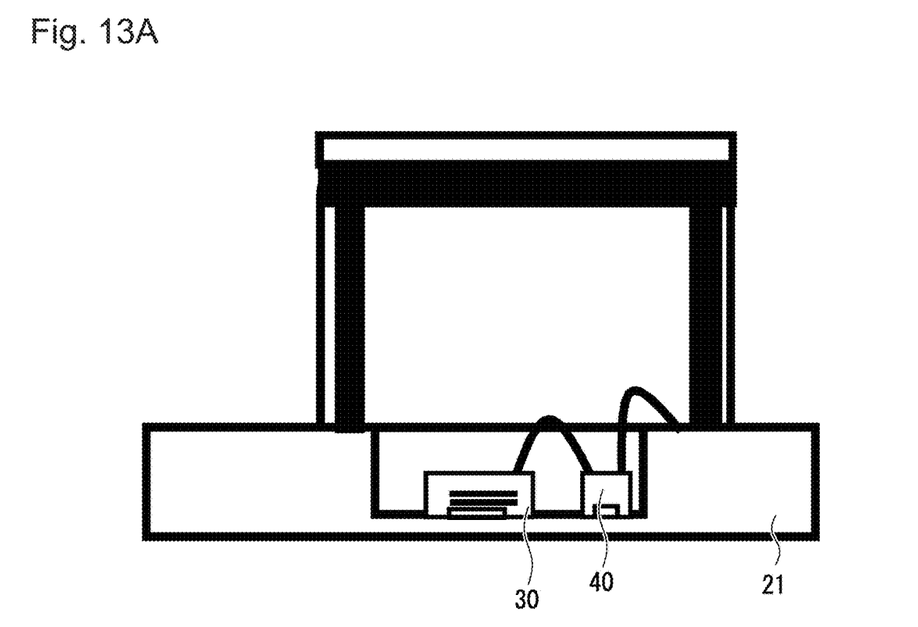
FIG. 13A is a diagram describing a main substrate to be used in the internal temperature sensor according to the above embodiments.
Figure 13B:
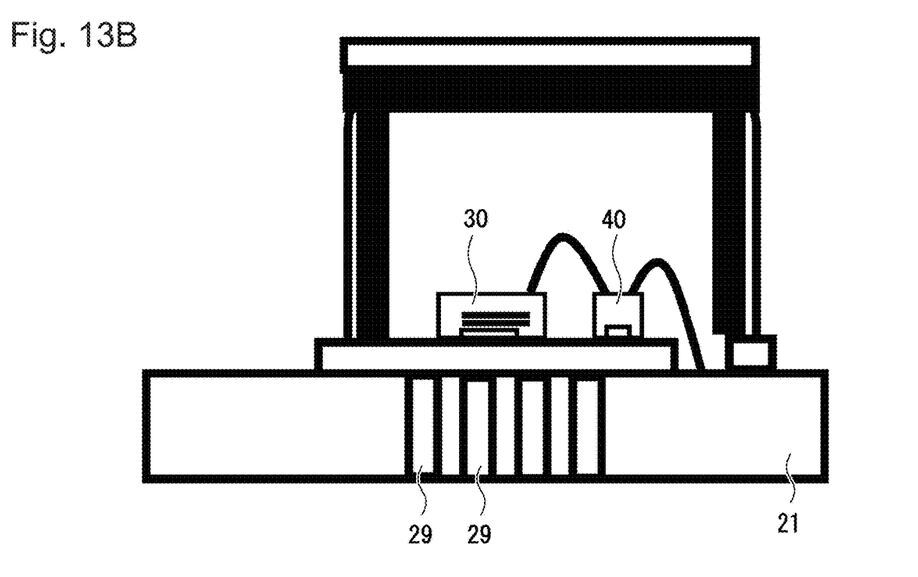
FIG. 13B is a diagram describing a main substrate to be used in the internal temperature sensor according to the embodiments.

As schematically shown in FIG. 13A, the main substrate 21 may include a thinner part on which the heat flux sensor 30 and the ASIC 40 are mounted. As schematically shown in FIG. 13B, the main substrate 21 may have a plurality of through holes filled with metal 29 to lower the average thermal resistance of the main substrate 21.

Figure 14:
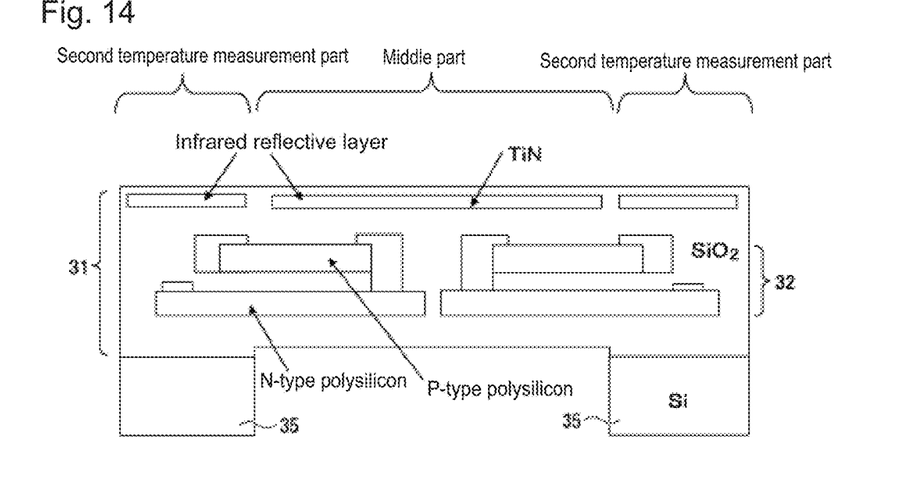
FIG. 14 is a diagram describing the structure of a heat flux sensor to be used in the internal temperature sensor according to the embodiments.

An infrared reflective layer, such as an Al layer, may be formed on the first and the second temperature measurement parts in the thin film, with its reflective surface being the upper surface. However, the infrared reflective layer can conduct heat and reduce the temperature difference between the first and the second temperature measurement parts in the thin film 31, and can lower the sensor performance. To prevent this, the infrared reflective layer may be formed from a material with low thermal conductivity. When a material with relatively high thermal conductivity is used for the infrared reflective layer, separate infrared reflective layers may be formed for the second temperature measurement parts and for the middle part (first temperature measurement part) as schematically shown in FIG. 14. The infrared reflective layer for the second temperature measurement parts may have a lower reflective surface to insulate heat and thus to increase the measurement accuracy. The structure shown in FIG. 14 reflects external infrared rays traveling toward the upper surface of the thin film 31, and thus prevents the thin film 31 from being heated by such infrared rays. This structure is particularly effective for the internal temperature sensor 20 without the housing 50.

The internal temperature sensor according to the above embodiments may be modified to a sensor without the arithmetic circuit 23 (sensor that directly outputs the outputs from the ASICs 40 and 40c), or to a sensor that directly outputs the outputs from the heat flux sensors 30 and 30c and the temperature sensor 41. However, the sensor that directly outputs the outputs from the heat flux sensors 30 to 30c and the temperature sensor 41 is vulnerable to noise. The internal temperature sensor may incorporate an amplifier that amplifies the outputs from the sensors.

The arithmetic circuit 23 may be modified to a circuit for calculating the internal temperature of an object by solving a heat conduction equation in accordance with the measurement results indicating the temperature difference and the temperature measured in time series by these sensors.

Figure 15:
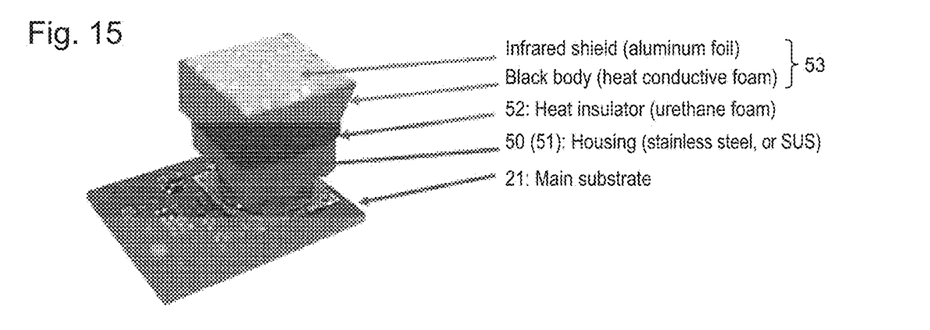
FIG. 15 is a diagram describing members to be used as a top plate and other parts.

The size of each part of the internal temperature sensor 20 may be changed as appropriate. For example, although the internal temperature sensor 20 shown in FIG. 1 includes the heat insulator 52 and the top plate 53 that are relatively thin, the heat insulator 52 and the top plate 53 may have any thickness. As shown in FIG. 15, for example, the heat insulator 52 may be a thick layer of urethane foam, and the top plate 53 may be formed from aluminum foil attached to a thick layer of electrically conductive foam as an infrared reflective plate.

The heat flux sensor 30 may contain (or be filled with) a material with low thermal conductivity under the thin film 31. The housing 50 may have its internal space filled with gas other than air, or the housing 50 may have a vacuum internal space.

REFERENCE SIGNS LIST 20, 20b, and 20c internal temperature sensor
21 main substrate
22 sensor substrate
23 arithmetic circuit
24 terminal
29 metal
30, 30c heat flux sensor
31, 31c thin film
32 thermopile
35 support
36 heat insulating structure for second temperature measurement parts
37 high thermal conductivity member
40, 40c ASIC
41 temperature sensor
50, 50b, 50c housing
51 side wall
52 heat insulator
53 top plate
54 infrared absorber
55 heat sink
56 radiator plate
58 soft material

The invention claimed is:

1. An internal temperature sensor, comprising:
a substrate having one surface to be placed in contact with a surface of an object to measure an internal temperature of the object;
a heat flux sensor arranged on another surface of the substrate, the heat flux sensor being fabricated through a micro electro mechanical systems process,
the heat flux sensor including a first temperature measurement part, a second temperature measurement part, and a thin film including a thermopile configured to detect a temperature difference between the first temperature measurement part and the second temperature measurement part,
the thin film being supported by a thermally conductive member to form a space between the first temperature measurement part and the substrate and to extend parallel to the substrate, the thermally conductive member being configured to conduct heat traveling from the object through the substrate to the second temperature measurement part; and
a temperature sensor configured to measure a temperature of a part of the substrate that is placed in contact with the thermally conductive member or a temperature of the second temperature measurement part of the thin film.

2. The internal temperature sensor according to claim 1, wherein
the thin film in the heat flux sensor comprises a heat radiation accelerating structure configured to accelerate heat radiation from the first temperature measurement part.

3. The internal temperature sensor according to claim 1, wherein
the thin film in the heat flux sensor comprises an infrared reflective structure configured to reflect infrared rays traveling toward a surface of the thin film not facing the substrate to prevent the thin film from being heated by the infrared rays.

4. The internal temperature sensor according to claim 1, further comprising:
a housing covering the heat flux sensor and the temperature sensor.

5. The internal temperature sensor according to claim 4, wherein the housing includes an infrared absorber arranged on an inner surface thereof.

6. The internal temperature sensor according to claim 4, wherein
the housing has an outer surface configured to reflect infrared rays and electromagnetic waves.

7. The internal temperature sensor according to claim 4, wherein
the housing includes a side wall surrounding the heat flux sensor and the temperature sensor, a heat insulator arranged at an end face of the side wall at an opening of the side wall, and a top plate attached to the side wall via the heat insulator to cover the opening of the side wall.

8. The internal temperature sensor according to claim 7, wherein the top plate is a heat sink or a radiator plate.

9. The internal temperature sensor according to claim 7, further comprising:
a member configured to transfer heat from the first temperature measurement part of the thin film to the top plate.

10. The internal temperature sensor according to claim 1, further comprising:
an amplifier configured to amplify an output from the heat flux sensor and an output from the temperature sensor.

11. The internal temperature sensor according to claim 10, further comprising:
an arithmetic unit configured to calculate the internal temperature of the object based on the output from the heat flux sensor and the output from the temperature sensor amplified by the amplifier.

* * * * *